United States Patent
Liu et al.

(10) Patent No.: US 10,600,857 B2
(45) Date of Patent: Mar. 24, 2020

(54) ORGANIC LIGHT EMITTING DISPLAY PANEL WITH AN INCREASED WIDTH OF WIRING

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Qi Liu, Beijing (CN); Lei Zhang, Beijing (CN); Yuqing Yang, Beijing (CN); Kun Guo, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 163 days.

(21) Appl. No.: 15/566,108

(22) PCT Filed: May 27, 2017

(86) PCT No.: PCT/CN2017/086268
§ 371 (c)(1),
(2) Date: Oct. 12, 2017

(87) PCT Pub. No.: WO2018/010499
PCT Pub. Date: Jan. 18, 2018

(65) Prior Publication Data
US 2019/0051716 A1    Feb. 14, 2019

(30) Foreign Application Priority Data
Jul. 13, 2016 (CN) .................. 2016 2 0736659 U (51) Int. Cl.
*H01L 27/32* (2006.01)
*H01L 51/52* (2006.01)

(52) U.S. Cl.
CPC ...... *H01L 27/3276* (2013.01); *H01L 51/5206* (2013.01); *H01L 51/529* (2013.01); *H01L 51/5221* (2013.01); *H01L 51/5237* (2013.01)

(58) Field of Classification Search
CPC ..... G02F 1/1345–13458; H01L 27/124–1244; H01L 27/3288–329;
(Continued)

(56) References Cited

U.S. PATENT DOCUMENTS

| 2009/0206752 A1* | 8/2009 | Nakanishi | ........... H01L 27/3276 313/506 |
| 2015/0219944 A1* | 8/2015 | Mitsumoto | ........... G02F 1/1339 349/138 |
| 2016/0246144 A1 | 8/2016 | Liao et al. | |

FOREIGN PATENT DOCUMENTS

| CN | 104503171 A | 4/2015 |
| CN | 104977736 A | 10/2015 |

(Continued)

OTHER PUBLICATIONS

International Search Report and Written Opinion dated Aug. 11, 2017; PCT/CN2017/086268.

*Primary Examiner* — Shaun M Campbell
*Assistant Examiner* — Suberr L Chi (57) ABSTRACT

An organic light emitting display panel includes a display region and a non-display region, the display region provided with a gate wiring, a data wiring, an anode wiring and a cathode, wherein the cathode is disposed in a central region of the display region, the gate wiring, the data wiring, and the anode wiring are disposed along an edge region of the display region; the gate wiring has a first gate wiring parallel to a first direction, the data wiring has a first data wiring
(Continued)

parallel to the first direction, the anode wiring has a first anode wiring parallel to the first direction, the first direction is a direction from the display region to the non-display region, a width of at least one of the first gate wiring, the first data wiring, and the first anode wiring, is gradually increased in the first direction.

18 Claims, 9 Drawing Sheets

(58) Field of Classification Search
CPC ... H01L 27/3297; H01L 27/3276–3279; H01L 27/326–3265; H01L 51/5029; H01L 51/5225; H01L 51/5203; H01L 51/5209
See application file for complete search history.

(56) References Cited

FOREIGN PATENT DOCUMENTS

| | | |
|---|---|---|
| CN | 205510815 U | 12/2016 |
| JP | 2006-047530 A | 2/2006 |

\* cited by examiner

ORGANIC LIGHT EMITTING DISPLAY PANEL WITH AN INCREASED WIDTH OF WIRING

TECHNICAL FIELD

Embodiments of the present invention relates to an organic light emitting display panel.

BACKGROUND

Currently, display technology mainly comprises liquid crystal display (LCD), organic light-emitting diode display (OLED), plasma display (Plasma Display Panel, PDP) and electronic ink display and etc. Among them, OLED device with its thin, active light, fast response speed, wide viewing angle, rich colors and high brightness, low power consumption, resistance to high and low temperatures and many other advantages is recognized in the industry as the third generation of display technology after the LCD display, and is widely used in smart phones, tablet PCs, television and other end products.

SUMMARY

At least one embodiment of the present disclosure provides an organic light emitting display panel comprising a display region and a non-display region, the display region provided with a gate wiring, a data wiring, an anode wiring and a cathode, wherein the cathode is disposed in a central region of the display region, the gate wiring, the data wiring, and the anode wiring are disposed along an edge region of the display region; the gate wiring has a first gate wiring parallel to a first direction, the data wiring has a first data wiring parallel to the first direction, the anode wiring has a first anode wiring parallel to the first direction, the first direction is a direction from the display region to the non-display region, a width of at least one of the first gate wiring, the first data wiring, and the first anode wiring, is gradually increased in the first direction.

In one embodiment of the present disclosure, a shape of at least one of the first gate wiring, the first data wiring, and the first anode wiring is trapezoid, a longer bottom edge of the trapezoid is disposed adjacent to the non-display region.

In one embodiment of the present disclosure, the trapezoid is an isosceles trapezoid.

In one embodiment of the present disclosure, the trapezoid is a right-angled trapezoid, and a bevel edge of the right-angled trapezoid is disposed towards inside or outside of the display panel.

In one embodiment of the present disclosure, the data wiring is located over the gate wiring, the anode wiring is located over the data wiring, and the cathode is above the anode wiring.

In one embodiment of the present disclosure, projection of the cathode on the display panel overlaps with projection of the anode wiring on the display panel to form a first overlapping region, and/or, projection of the anode wiring on the display panel overlaps projection of the data wiring on the display panel to form a second overlapping region, projection of the data wiring on the display panel overlaps projection of the gate wiring on the display panel to form a third overlapping region, each of the first overlapping region, the second overlapping region, and the third overlapping region is parallel to the first direction.

In one embodiment of the present disclosure, the cathode is connected with the anode wiring through a first slot provided in the first overlapping region; and/or the anode wiring is connected with the data wiring through a second slot provided in the second overlapping region; and/or the data wiring is connected with the gate wring through the a third slot provided in the third overlapping region.

In one embodiment of the present disclosure, extending direction of the first slot, the second slot, and the third slot is the same as extending direction of the first direction, lengths of the first slot, the second slot and the third slot in the first direction are respectively equal to the lengths of the cathode, the anode wiring and the data wiring in the first direction.

In the organic light emitting display panel according to the embodiments of the present disclosure, lengths of the first slot, the second slot, and the third slot in the first direction are respectively equal to the lengths of the cathode, the anode wiring and the data wiring in the first direction, i.e. there is a longer connection area between the cathode and the anode wiring, between the anode wiring and the data wiring, and between the data wiring and the gate wiring, which in turn, improves gate wiring, data wiring, and anodic wiring in conventional arts. As the current is too concentrated in the via connection area, the problem that brightness in areas where each wiring of the display region is located is uneven is removed.

In one embodiment of the present disclosure, an insulating layer is provided between the cathode and the anode wiring, between the anode wiring and the data wiring, and between the data wiring and the gate wiring.

In one embodiment of the present disclosure, the gate wiring further comprises a second gate wiring disposed in a direction perpendicular to the first direction, the data wiring further comprising a second gate wiring disposed in a direction perpendicular to the first direction, and the anode wiring further comprise a second anode wiring disposed in a direction perpendicular to the first direction, each of vertical projections of the gate wiring, the data wiring, and the anode wiring on the display panel forms a closed four-sided frame.

In one embodiment of the present disclosure, the projection of the gate wiring surrounds the projection of the data wiring, the projection of the data wiring surrounds the projection of the anode wiring, the projection of the anode wiring surrounds the projection of the cathode.

In one embodiment of the present disclosure, the gate wiring further comprises a gate lead connected to a gate lead terminal in the non-display region; and the data wiring further comprises a data lead connected to a data lead terminal in the non-display region.

In the organic light emitting display panel according to the present embodiments of the present disclosure, the widths of the first wirings of the gate wiring, the data wiring and the anode wiring are gradually increased in the direction from the display region to the non-display area, gradually reducing the resistance of the first gate wiring, the first data wiring, and the first anode wiring in the direction from the display region to the non-display region, thereby gradually mitigating ununiform heat generated by the first gate wiring, the first data wiring and the first anode wiring in the direction from the display region to the non-display region, effectively solving the problem that brightness in the area of the display panel where the gate wiring, the data wiring and the anode wiring are located along the first direction is uneven.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
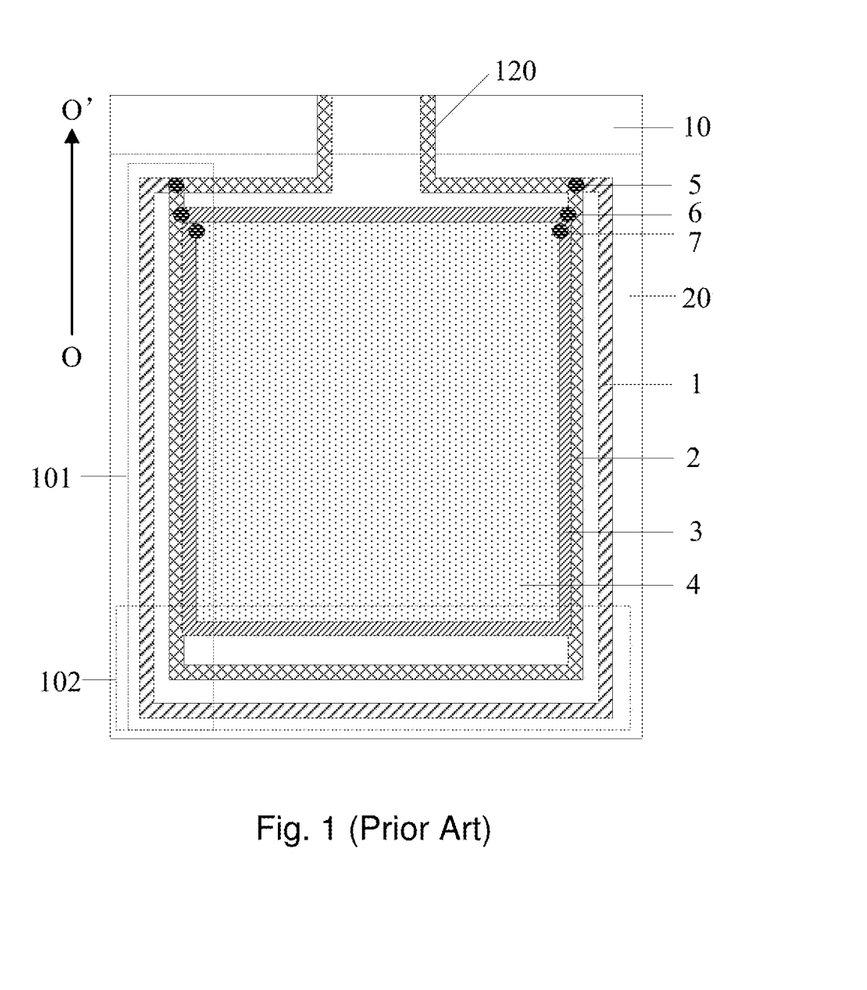
FIG. 1 is a schematic structural view of an organic light emitting display panel of conventional arts.

FIG. 1 shows a schematic structural view of an organic light emitting display panel of conventional arts, comprising a display region 20 and a non-display region 10, and in the display region 20, in the propagation direction of light, a gate wiring 1, a data wiring 2 located above the gate wiring 1, an anode wiring 3 located above the data wiring 2, and a cathode 4 located above the anode wiring 3 are disposed in sequence, wherein the cathode 4 has a shape of plane and is arranged in the center region of the display region 20, each of the gate wiring 1, the data wiring 2 and the anode wiring 3 has a shape of line and arranged along the edge region of the display area 20; each of the gate wiring 1, the data wiring 2 and the anode wiring 3 has a first wiring 101 parallel to the first direction and a second wiring 102 perpendicular to the first direction, the first direction being a direction from the display region 20 to the non-display region 10, as indicated by an arrow O-O' in the figure.

Figure 2:
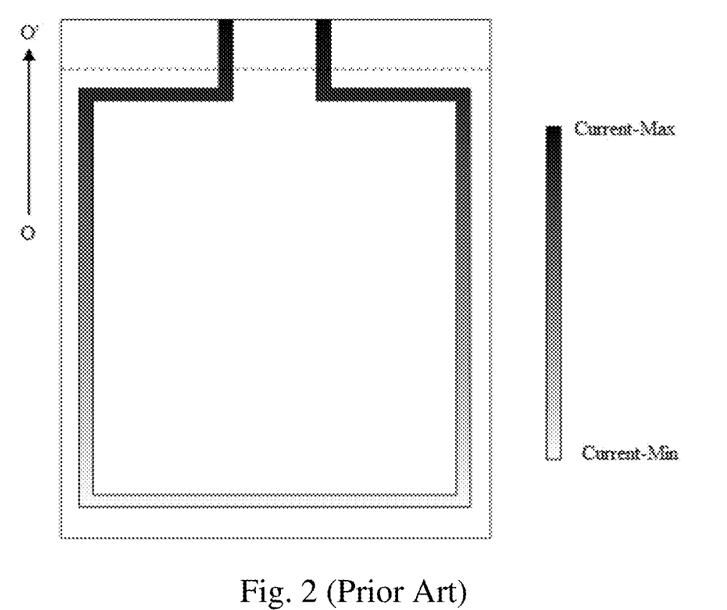
FIG. 2 is a schematic diagram showing current distribution of the organic light emitting display panel of conventional arts.
Figure 3:
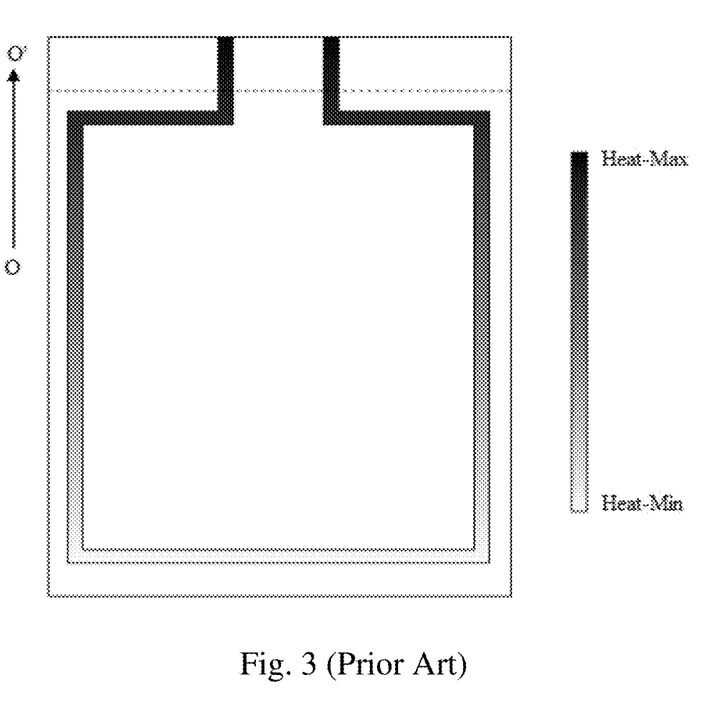
FIG. 3 is a schematic view showing heat distribution of the organic light emitting display panel of conventional arts.

In the organic light emitting display panel, the gate wiring 1, each of the data wiring 2 and the anode wiring 3 has a uniform width in the first direction, and after the supply current from the data lead terminal 120 of the data wiring 2 is supplied to the display region 20 through the non-display region 10, the supply current are supplied to the gate wiring 1, the anode wiring 3 and the cathode via the data wiring 2 through various vias provided at the end of the display region 20. That is, as shown in FIG. 1, the gate wiring 1 is connected to the data wiring 2 though the first through hole 5, and the current on the data wiring 2 is supplied to the gate wiring 1; the data wiring 2 is connected with the anode wiring 3 through the second through hole 6, and the current on the data wiring 2 is supplied to the anode wiring 3; and the anode wiring 3 is connected with the cathode 4 through the third through hole 7, and the current on the anode wiring 3 is supplied to the cathode 4. That is, a current connection area of the organic light emitting display panel is generally provided at the end of the gate wiring 1, the data wiring 2 and the anode wiring 3 in the direction from the display region 20 to the non-display region 10, such that the currents on the gate wiring 1, the data wiring 2 and the anode wiring 3 is gradually increased in the direction the display region 20 to the non-display region 10, as shown in FIG. 2. And as more heat will be generated in a region where a larger current flows, as shown in FIG. 3, light emitting efficiency of the light emitting material in the corresponding location is attenuated to a greater degree, finally leading to un-uniform brightness in the region of the display panel where the gate wiring 1, data wiring 2 and the anode wiring 3 are located in the first direction.

Figure 4A:
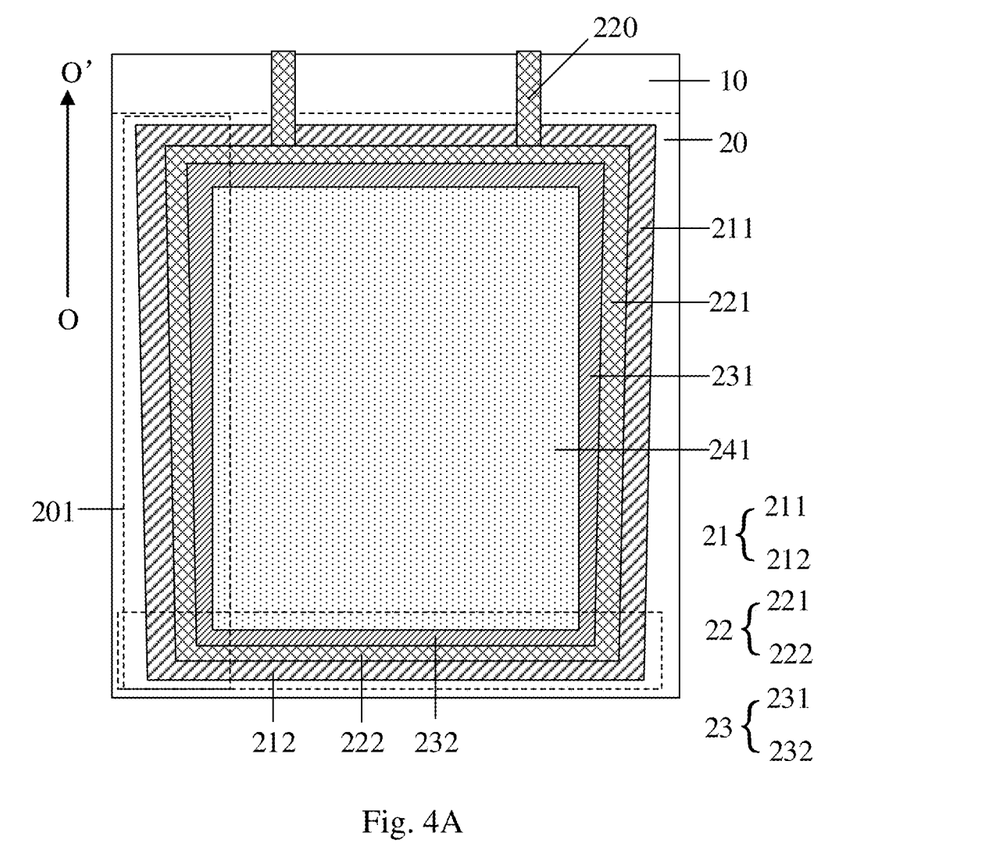
FIG. 4A is a schematic structural view of an organic light emitting display panel according to one embodiment of the present disclosure.
Figure 4B:
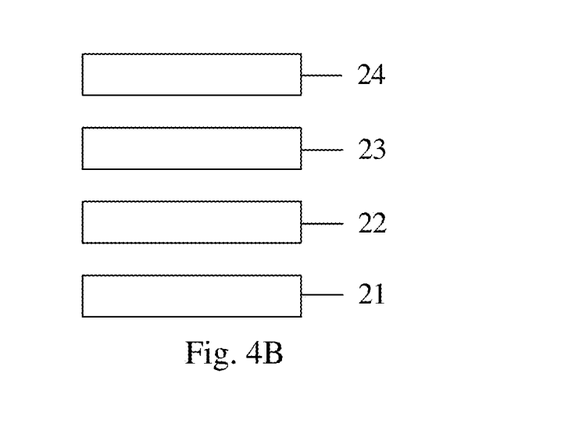
FIG. 4B is a schematic diagram illustrating positional relation between the data wiring, the gate wiring, the anode wiring and the cathode.

At least one embodiment of the present disclosure provides an organic light emitting display panel, as illustrated in FIG. 4A and FIG. 4B, the display panel comprises a display region 20 and a non-display region 10. The display region 20 comprises a gate wiring 21, a data wiring 22, an anode wiring 23, and a cathode 24, wherein the cathode 24 has a planar shape and is disposed in the center region of the display region 20, and the gate wiring 21, the data wiring 22, and the anode wiring 23 have a shape of line, and are arranged along the edge region of the display region 20; the gate wiring 21 has a first gate wiring 211 parallel to the first direction and a second gate wiring 212 perpendicular to the first direction, the data wiring 22 has a first data wiring 221 parallel to the first direction and a second data wiring 222 perpendicular to the first direction, the anode wiring 23 has a first anode wiring 231 parallel to the first direction and a second anode wiring 232 perpendicular to the first direction, the first direction is a direction from the display region 20 to the non-display region 10, as indicated by the arrow O-O' in FIG. 1; wherein width of at least one of the first gate wiring 211, the first data wiring 221, and the first anode wiring 231 is gradually increased in the first direction. The organic light emitting display panel further has a lead terminal for introducing a current from the non-display region into the display region. For example, the data wiring 22 can have a data lead terminal 220 connected to the non-display region 10, or a gate wiring 21 can have a gate lead terminal connected to the non-display region 10, or both the data wiring 22 and the gate wiring 21 have lead terminals connected to the non-display region 10, the data wiring 22 having a date lead terminal 220 connected to the non-display region 10 and the gate wiring 21 having a gate lead terminal connected to the non-display region 10, respectively. In implementation, the lead terminal can be flexibly provided according to requirements, and it is not restricted herein.

In the organic light emitting display panel according to the present embodiment, width of at least one of the first gate wiring, the first data wiring, and the first anode wiring is gradually increased along the first direction, resistance of the first wirings of the gate wiring, the data wiring and the anode wiring in the direction from the display region to the Don-display region is gradually decreased, thereby gradually mitigating the phenomenon that the first gate wiring, the first data wiring and the first anode wiring nonuniformly generate heat in the direction from the display region to the non-display region on the display panel and effectively resolving the problem that brightness is not uniform in a region of the display panel where the gate wiring, the data wiring and the anode wiring are located.

Figure 5:
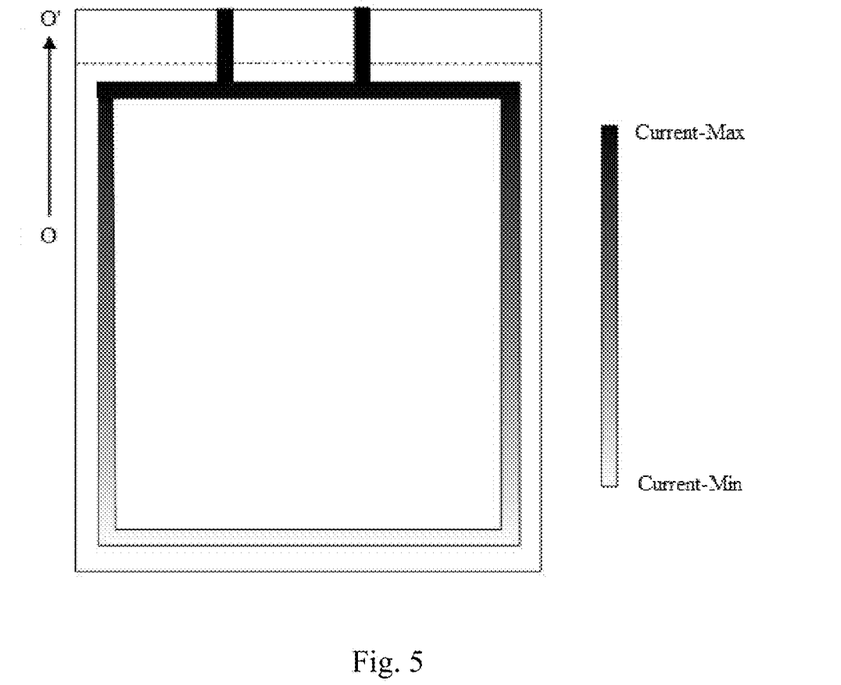
FIG. 5 is a schematic diagram illustrating current distribution of an organic light emitting display panel according to one embodiment of the present disclosure.
Figure 6:
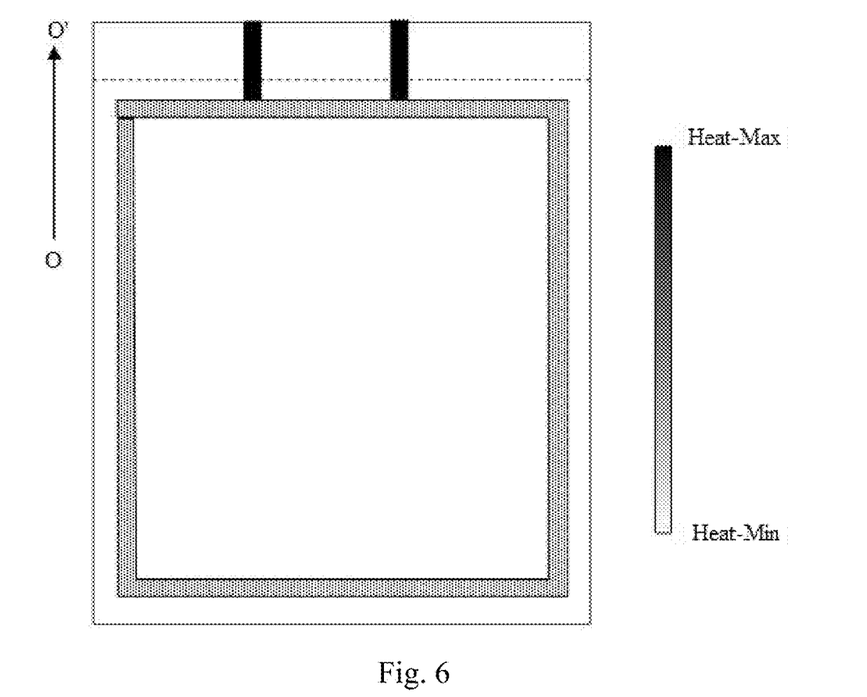
FIG. 6 is a schematic view illustrated heat distribution of the organic light emitting display panel according to one embodiment of the present disclosure.

FIG. 5 is a schematic diagram illustrating current distribution of an organic light emitting display panel according to one embodiment of the present disclosure, and FIG. 6 is a schematic view illustrated heat distribution of the organic light emitting display panel according to one embodiment of the present disclosure. In the organic light emitting display panel according to one embodiment of the present disclosure, width of at least one of the first gate wiring 211, the first data wiring 221, and the first anode wiring 231 is gradually increased along a direction from the display region 20 to the non-display region 10. In the situation that the supplied current is constant, by reducing the resistance of at least one of the first gate wiring 211, the first data wiring 221, and the first anode wiring 231 in the direction from the display region 20 to the non-display region 10, the phenomenon that at least one of the first gate wiring, the first data wiring and the first anode wiring nonuniformly generate heat in the direction from the display region 20 to the non-display region 10 is further mitigated, and the problem that brightness is not uniform in a region of the display panel where the gate wiring 21, the data wiring 22 and the anode wiring 23 are located in the first direction can be effectively resolved.

For the gate wiring 21, the data wiring 22, the anode wiring 23, and the cathode 24, there is usually no direct contact between either of them, and an insulating layer is provided therebetween. The positional relationship between the gate wiring 21, the data wiring 22, the anode wiring 23, and the cathodes 24 can be arranged according to requirements during implementation, which is not restricted herein. In one embodiment according to the present disclosure, the positional relationship of the gate wiring 21, the data wiring 22, the anode wiring 23, and the cathode 24 is such arranged that the data wiring 22 is located above the gate wiring 21, the anode wiring 23 is located above the data wiring 22 and the cathode 24 is located above the anode wiring 23. In such an arrangement, an insulating layer is each provided between the gate wiring 21 and the data wiring 22 located above, between the data wiring 22 and the anode wiring 23 located above, and between the anode wiring 23 and the cathode 24 located above.

Figure 7:
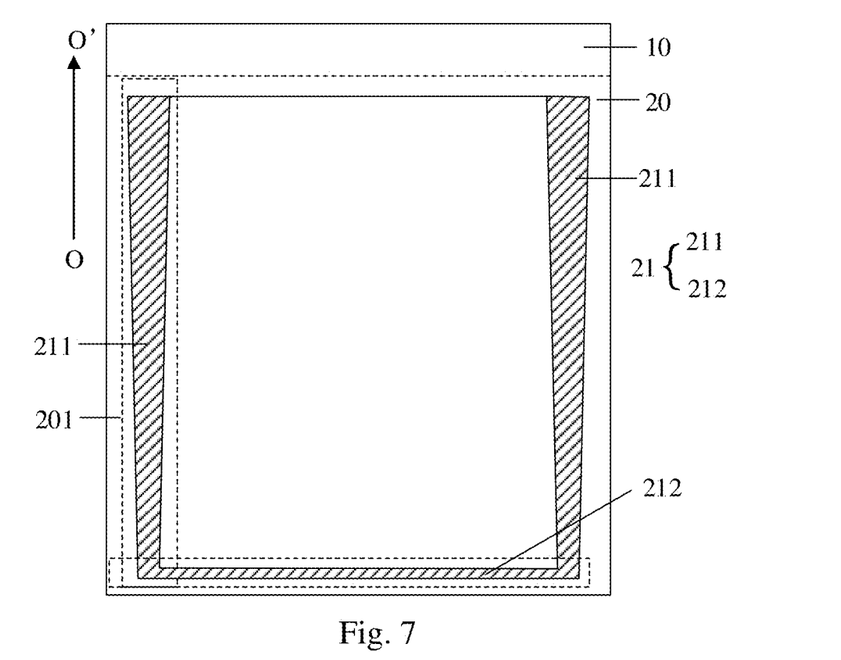
FIG. 7 is a schematic structural view of a gate wiring according to one embodiment of the present disclosure.
Figure 8:
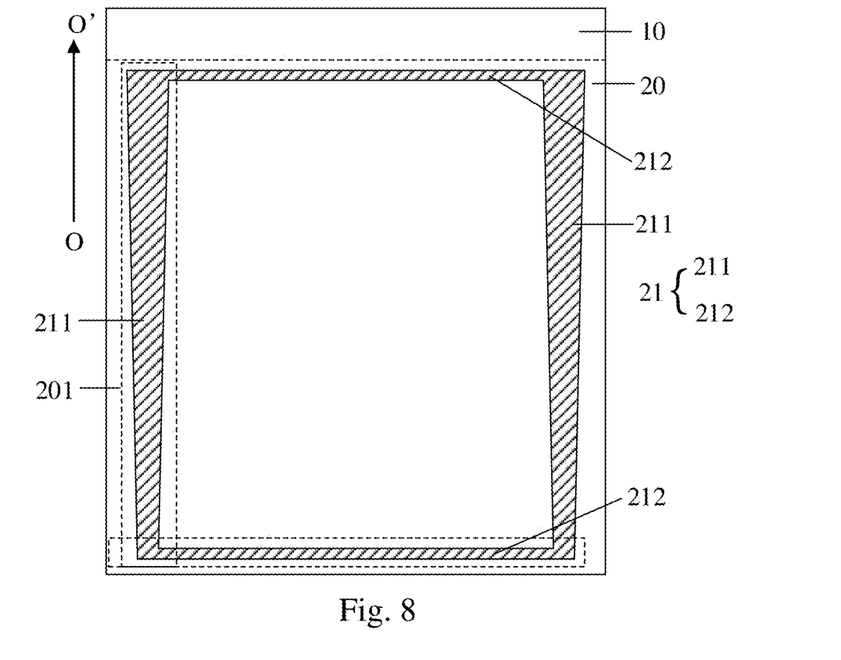
FIG. 8 is a schematic structural view of a gate wiring according to another embodiment of the present disclosure.
Figure 9:
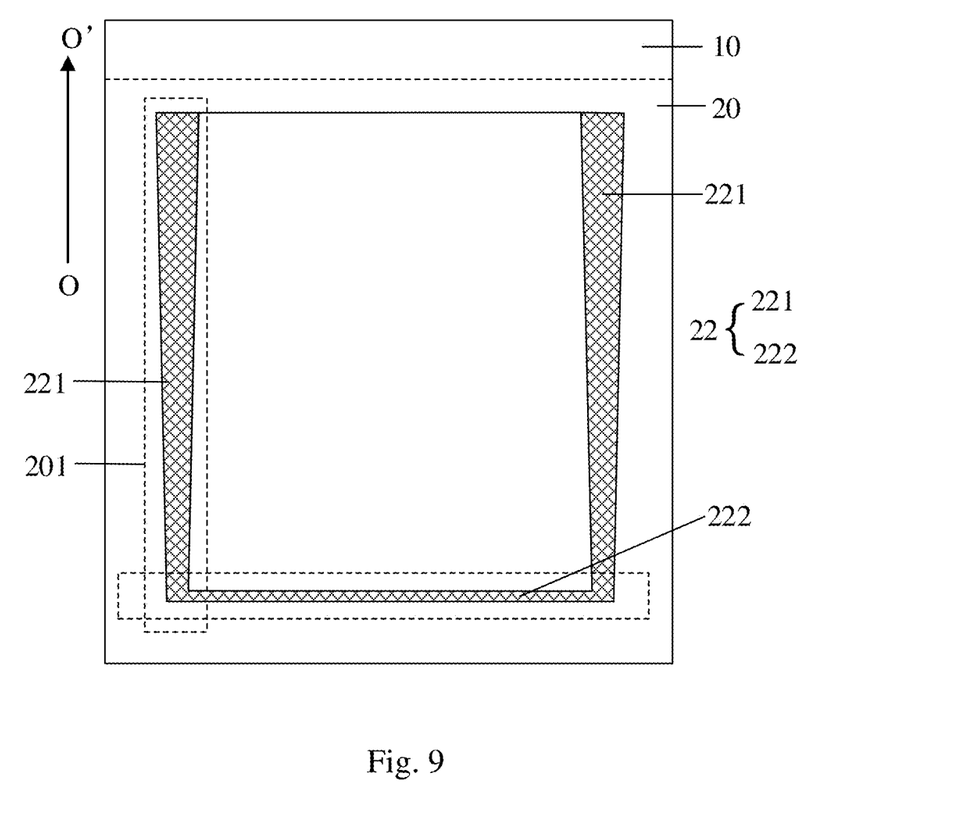
FIG. 9 is a schematic structural view of a data wiring according to one embodiment of the present disclosure.
Figure 10:
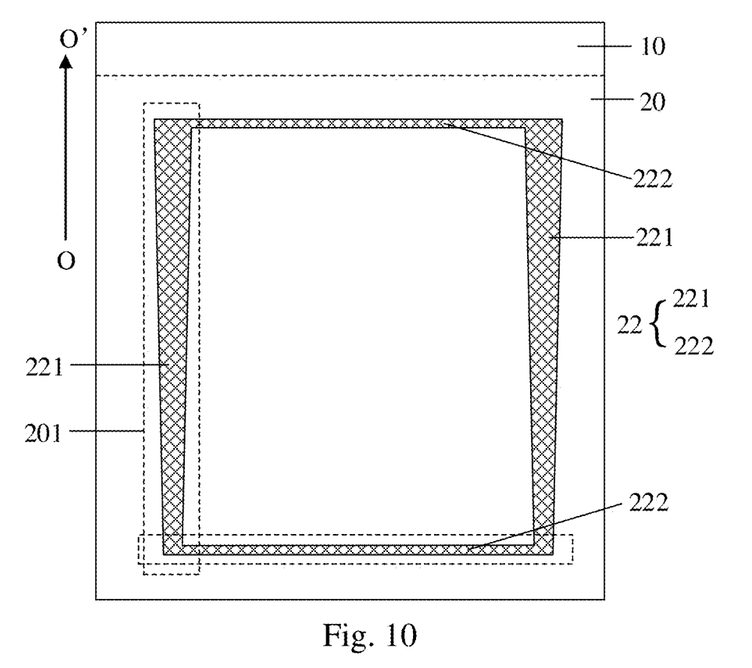
FIG. 10 is a schematic structural view of a data wiring according to another embodiment of the present disclosure.
Figure 11:
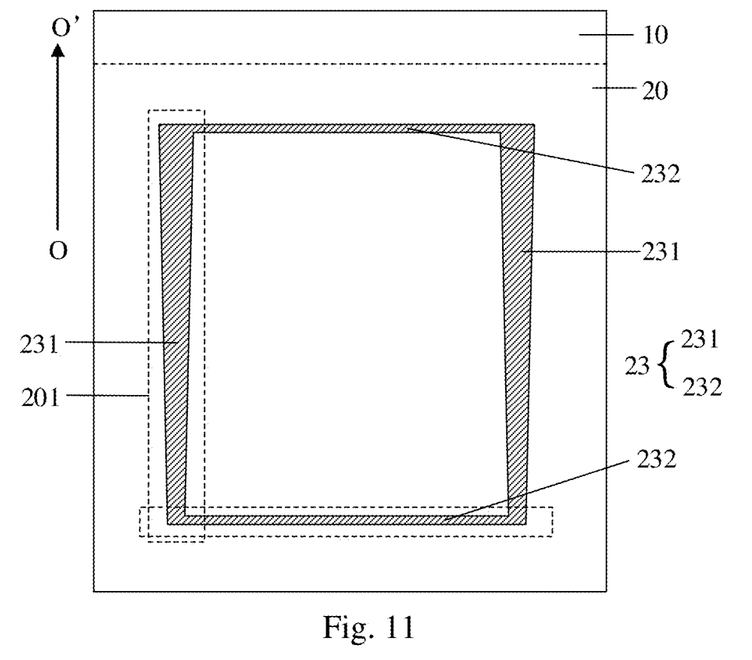
FIG. 11 is a schematic structural view of an anode wiring according to one embodiment of the present disclosure.

It is to be noted that, in the embodiment according to the present disclosure, the non-display region 10 is provided at one end portion of the display panel in which the driving circuit of the display panel is generally provided, and the display panel except the non-display region 10 can be understood as the display region 20. The first direction from the display region 20 to the non-display region 10 can be understood as the vertical direction, i.e. the first direction is from the display region 20 to the non-display region 10 and is perpendicular to the boundary between the display region 20 and the non-display region 10. The gate wiring 21, the data wiring 22 and the anode wiring 23 have a shape of line and are disposed along the edge region of the display region 20, the gate wiring 21 has a first gate wiring 211 parallel to the first direction and a second gate wiring 212 perpendicular to the first direction, the data wiring 22 has a first data wiring 221 parallel to the first direction and a second data wiring 222 perpendicular to the first direction, and the anode wiring 23 has a first anode wiring 231 parallel to the first direction, and a second anode wiring 232 perpendicular to the first direction. That is, the gate wiring 21 has two first gate wirings 211 parallel to the first direction and one or two second gate wiring(s) 212 perpendicular to the first direction, and if there is one second gate wiring 212, the two first gate wirings 211 and one second gate wiring 212 of the gate wiring 21 causes the gate wiring 21 to form a three-sided frame with one end not closed, as illustrated in FIG. 7. If the gate wiring 21 has two second wirings 212, the two first gate wirings 211 and the two second gate wirings 212 of the gate wiring 21 can make the gate wiring 21 to form a closed four-sided frame, as illustrated in FIG. 8. In an embodiment according to the present disclosure, in order to provide a better display effect for the display panel, the gate wiring 21 has two second gate wirings 212, two first gate wirings 211 and the two second gate wirings 212 are connected to each other so that the gate wiring 21 forms a closed four-sided frame. Similarly, the data wiring 22 has two first data wirings 211 parallel to the first direction and one or two second wiring(s) 212 perpendicular to the first direction, one second data wiring 222 of the data wiring 22 and two first data wirings 221 can cause the data wiring 22 to form a three-sided frame with one end not closed, as illustrated in FIG. 9. The two second data wirings 222 of the data wiring 22 and the two first data wirings 221 can make the data wiring 22 to form a closed four-sided frame, as illustrated in FIG. 10. In one embodiment according to the disclosure, the data wiring has two second data wirings 222, and the two second data wirings 222 of the data wiring 22 are connected to the two first data wirings 221, respectively, making the data wiring 22 form a closed four-sided frame. The anode wiring 23 generally have two first anode wirings 231 and two second anode wirings 232, the two first anode wirings 231 and the two second anode wirings 232 of the anode wiring 23 are connected to each other, So that the anode wiring 23 forms a closed four-sided frame, as illustrated in FIG. 11.

It should be noted that, FIGS. 4A to 11 of the present disclosure illustrates that the shape of the first gate wiring 211, the first data wiring 221, and the first anode wiring 231 are trapezoid, i.e., the embodiment of the present disclosure is described by taking a shape of wiring in which the width of the first gate wiring 211, the first data wiring 221, and the first anode wiring 231 (perpendicular to its extending direction) gradually increasing, that is, the width of the wiring gradually increasing in the first direction, as an example. The first gate wiring 211, the first data wiring 221, and the first anode wiring 231 can further have a shape of step with a gradually increasing width. And the first gate wiring 211, the first data wiring 221, and the first anode wiring 231 can further have a shape of arc with a gradually increasing width. The shape of the first gate wiring 211, the first data wiring 221, and the first anode wiring 231 can be arranged according to requirements in implementation, which is not restricted herein.

Figure 12:
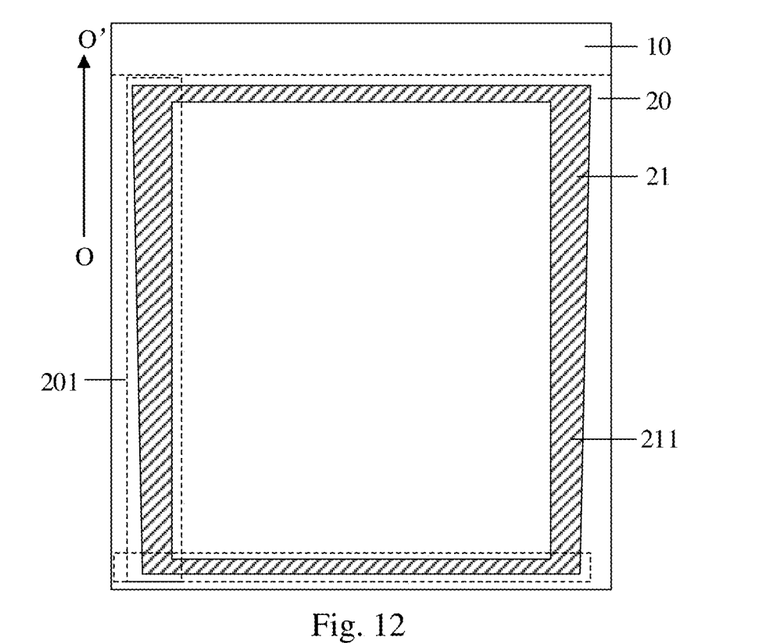
FIG. 12 is a schematic structural view of a gate wiring according to another embodiment of the present disclosure.
Figure 13:
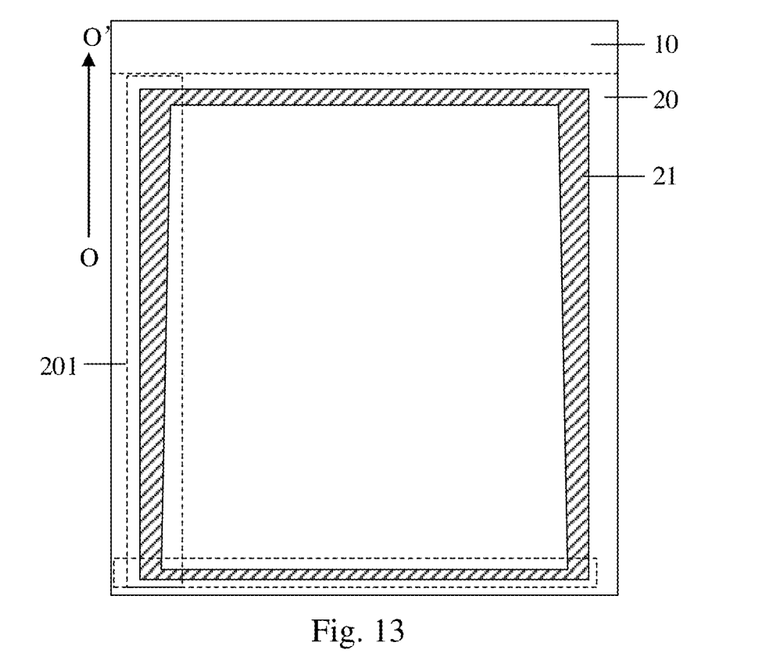
FIG. 13 is a schematic view of the structure of a gate wiring of the display panel according to one embodiment of the present disclosure, in which the inner side of the gate wiring facing the display panel is widened.

In order to facilitate production and simplify the process, in one embodiment of the present disclosure, at least one of the first gate wiring 211, the first data wiring 221, and the first anode wiring 231 has a shape of line with a gradually increasing width, that is, The shape of at least one of the first gate wiring 211, the first data wiring 221, and the first anode wiring 231 is a trapezoid as a whole, and the longer bottom edge of the trapezoid is disposed adjacent to the non-display region 10. For example, the shape of at least one of the first gate wiring 211, the first data wiring 221, and the first anode wiring 231 can be an isosceles trapezoid, as illustrated in FIGS. 7-11, both sides of at least one of the first gate wiring 211, the first data wiring 221, and the first anode wiring 231 are simultaneously widened with respect to its width in the conventional arts; and at least one of the first gate wiring 211, the first data wiring 221 and the first anode wiring 231 can be have a shape of right-angled trapezoid, and the bevel edge of the right-angled trapezoid is facing toward the inside (i.e., disposed adjacent to the cathode 24) or outside (i.e., away from the cathode 24) of the display panel. For example, with respect to a wiring of the gate electrode of conventional arts in the first direction, the first wiring 201 of the gate wiring 21 in the first direction, i.e., the first gate wiring 211, is widened on at one side. As illustrated in FIG. 12, the outside of the gate wiring 21 toward the outside of the display panel is widened, and as illustrated in FIG. 13, the inside of the gate wiring 21 toward the inside of the display panel is widened.

In the organic light emitting display panel according to the embodiments of the present disclosure, at least one of the first gate wiring, the first data wiring, and the first anode wiring has a shape of trapezoid, thereby making the manufacturing process simple and convenient.

It is to be noted that, in the organic light emitting display panel according to the present embodiment, the positional relationship between the gate wiring 21, the data wiring 22, the anode wiring 23, and the cathode 24 is such that the data wiring 22 is located at the gate wiring 21, the anode wiring 23 is located above the data wiring 22 and the cathode 24 is located above the anode wiring 23, and in a direction perpendicular to the display panel, the projection of the gate wiring 21 surrounds the projection of the data wiring 22, the projection of the data wiring 22 surrounds the projection of the anode wiring 23, the projection of the anode wiring 23 surrounds the projection of the cathode 24, and the projection of the cathode 24 on the display panel overlaps the projection of the anode wiring 23 on the display panel so as to form a first overlapping region, the projection of the anode wiring 23 on the display panel overlap the projection of the data wiring 22 on the display, panel so as to form a second overlapping region, projection of the data wiring 22 on the display panel overlaps projection of the gate wiring 21 on the display panel so as to form a third overlapping region, and each of the first overlapping region, the second overlapping region, and the third overlapping region is parallel to the first direction.

In conventional arts, the cathode 24 is connected to the anode wiring 23, the anode wiring 23 is connected to the data wiring 22, the data wiring 22 is connected to the gate wiring 21, respectively, through a through hole, the current is relatively aggregated around the through hole, resulting in local overheating, which led to the luminous efficiency of the luminous material in corresponding locations attenuated to a greater degree.

Figure 14:
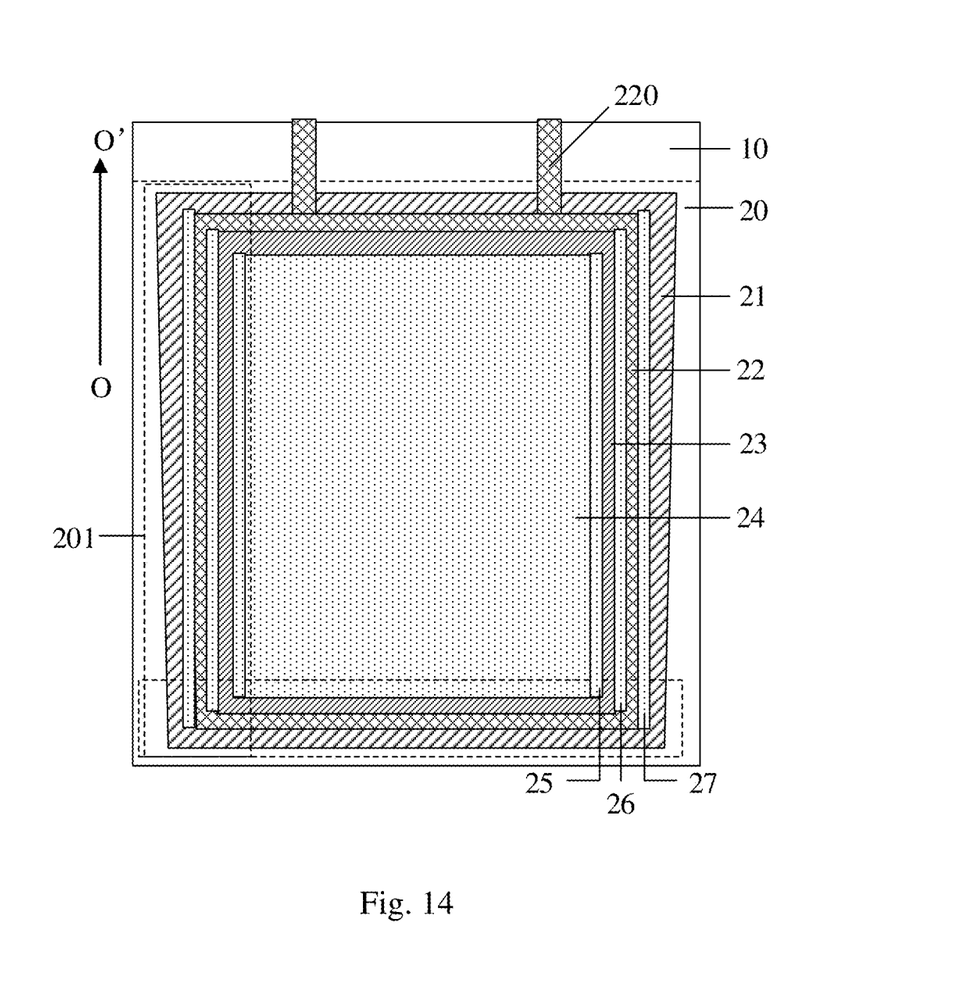
FIG. 14 is a schematic structural view of a display panel provided with a connection gap according to one embodiment of the present disclosure.

In one embodiment of the present disclosure, the cathode 24 is connected to the anode wiring 23, the anode wiring 23 is connected to the data wiring 22, the data wiring 22 is connected to the gate wiring 21, respectively, through a slot, as illustrated in FIG. 14. That is, the cathode 24 is connected to the anode wiring 23 through a first slot 25 provided in the first overlapping region; the anode wiring 23 is connected to the data wiring 22 through a second slot 26 provided in the second overlapping region, and the data wiring 22 is connected to the gate wiring 21 through a third slot 27 provided in the third overlapping region. In this way, by enlarging the connection area between the respective wirings, it is possible to improve nonuniform brightness in a region of the display panel where the first gate wiring 211, the first data wiring 221, and the first anode wiring 231 are located along the first direction due to the aggregation of current around the through holes. When the positional relationship between the gate wirings 21, the data wirings 22, the anode wirings 23 and the cathodes 24 changes, corresponding slots can be provided according to requirements, and will not be elaborated here.

In the organic light emitting display panel according to the present embodiment, the cathode is connected to the anode wiring through the first slot; the anode wiring is connected to the data wiring through the second slot; and the data wiring is connected to the gate wiring through the third slot, thereby mitigating nonuniform heat generated in a region of the display panel wherein the gate wiring, the data wiring, the anode wiring are located along the first direction due to aggregation of current around through holes when the wirings are connected to each other through through holes in conventional arts, which case uneven in brightness in a region of the display region where the gate wiring, the data wiring, the anode wiring are located along the first direction.

In one embodiment of the present disclosure, the extending direction of the first slot 25, the second slot 26, and the third slot 27 is the same as the extending direction of the first direction, and lengths of the first slot 25, the second slot 26, and the third slot 27 in the first direction are equal to the lengths of the cathode 24, the first anode wiring 231, and the first data wiring 221 in the first direction, respectively. In the organic light emitting display panel according to this embodiment, the lengths of the first slot 25, the second slot 26, and the third slot 27 in the first direction are respectively equal to the lengths of the cathode 24, the first anode wiring 231, and the first data wiring 221 in the first direction, i.e. between the cathode 24 and the first anode wiring 231, between the first anode wiring 231 and the first data wiring 221, between the first data wiring 221 and the first gate wiring 211, there is a relatively long connection area, thereby mitigating aggregation of currents on the gate wiring 21, the data wiring 22 and the anode wiring 23 around the through holes, and effectively solving uneven brightness in the display panel due to great attenuation of luminous efficiency of the luminous material in corresponding locations.

In the organic light emitting display panel according to the present embodiment, the width of the first gate wiring 211, the first data wiring 221, and the first anode wiring 231 in the direction from the display region 20 to the non-display region 10 gradually increases, and in the situation that the supply current is constant, resistance of the first gate wiring 211, the first data wiring 221 and the first anode wiring 231 along the direction from the display region 20 to the non-display region 10 is reduced, thus mitigating nonuniform heat generated by the first gate wiring 211, the first data wiring 221 and the first anode wiring 231 along the direction from the display region 20 to the non-display region 10, thereby effectively solving the uneven brightness in a region of the display panel where the first gate wiring 211, the first data wiring 221 and the first anode wiring 231 are located.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201620736659.8 filed on Jul. 13, 2016, the disclosure of which is hereby entirely incorporated by reference.

The invention claimed is:

1. An organic light emitting display panel comprising a display region and a non-display region, the display region provided with a gate wiring, a data wiring, an anode wiring and a cathode, wherein the cathode is disposed in a central region of the display region, the gate wiring, the data wiring, and the anode wiring are disposed along an edge region of the display region; the gate wiring has a first gate wiring parallel to a first direction, the data wiring has a first data wiring parallel to the first direction, the anode wiring has a first anode wiring parallel to the first direction, the first direction is a direction from the display region to the non-display region, a width of at least one of the first gate wiring, the first data wiring, and the first anode wiring, is gradually increased in the first direction, wherein a shape of at least one of the first gate wiring, the first data wiring, and the first anode wiring is trapezoid, a longer bottom edge of the trapezoid is disposed adjacent to the non-display region, and wherein the data wiring is located over the gate wiring, the anode wiring is located over the data wiring, and the cathode is above the anode wiring.

2. The display panel according to claim 1, wherein the trapezoid is an isosceles trapezoid.

3. The display panel according to claim 2, wherein the gate wiring further comprises a second gate wiring disposed in a direction perpendicular to the first direction, the data wiring further comprising a second data wiring disposed in a direction perpendicular to the first direction, and the anode wiring further comprise a second anode wiring disposed in a direction perpendicular to the first direction, each of the projections of the gate wiring, the data wiring, and the anode wiring on the display panel forms a closed four-sided frame.

4. The display panel according to claim 2, wherein the gate wiring further comprises a gate lead terminal connected to the non-display region; and the data wiring further comprises a data lead terminal connected to the non-display region.

5. The display panel according to claim 1, wherein the trapezoid is a right-angled trapezoid, and a bevel edge of the right-angled trapezoid is disposed towards inside or outside of the display panel.

6. The display panel according to claim 1, wherein a projection of the cathode on the display panel overlaps a projection of the anode wiring on the display panel to form a first overlapping region, and/or, the projection of the anode wiring on the display panel overlaps a projection of the data wiring on the display panel to form a second overlapping region, the projection of the data wiring on the display panel overlaps a projection of the gate wiring on the display panel to form a third overlapping region, each of the first overlapping region, the second overlapping region, and the third overlapping region is parallel to the first direction.

7. The display panel according to claim 6, wherein the cathode is connected with the anode wiring through a first slot provided in the first overlapping region; and/or the anode wiring is connected with the data wiring through a second slot provided in the second overlapping region; and/or the data wiring is connected with the gate wiring through the a third slot provided in the third overlapping region.

8. The display panel according to claim 6, wherein an insulating layer is provided between the cathode and the anode wiring, between the anode wiring and the data wiring, and between the data wiring and the gate wiring.

9. The display panel according to claim 7, wherein an extending direction of the first slot, the second slot, and the third slot is the same as an extending direction of the first direction, lengths of the first slot, the second slot and the third slot in the first direction are respectively equal to the lengths of the cathode, the anode wiring and the data wiring in the first direction.

10. The display panel according to claim 7, wherein an insulating layer is provided between the cathode and the anode wiring, between the anode wiring and the data wiring, and between the data wiring and the gate wiring.

11. The display panel according to claim 9, wherein an insulating layer is provided between the cathode and the anode wiring, between the anode wiring and the data wiring, and between the data wiring and the gate wiring.

12. The display panel according to claim 1, wherein an insulating layer is each provided between the cathode and the anode wiring, between the anode wiring and the data wiring, and between the data wiring and the gate wiring.

13. The display panel according to claim 1, wherein the gate wiring further comprises a second gate wiring disposed in a direction perpendicular to the first direction, the data wiring further comprising a second data wiring disposed in a direction perpendicular to the first direction, and the anode wiring further comprise a second anode wiring disposed in a direction perpendicular to the first direction, each of the projections of the gate wiring, the data wiring, and the anode wiring on the display panel forms a closed four-sided frame.

14. The display panel according to claim 13, wherein, in a direction perpendicular to the display panel, the projection of the gate wiring surrounds the projection of the data wiring, the projection of the data wiring surrounds the projection of the anode wiring, and the projection of the anode wiring surrounds the projection of the cathode.

15. The display panel according to claim 1, wherein the gate wiring further comprises a gate lead terminal connected to the non-display region; and the data wiring further comprises a data lead terminal connected to the non-display region.

16. The display panel according to claim 1, wherein the cathode has a shape of plane.

17. The display panel according to claim 1, wherein the gate wiring further comprises a second gate wiring disposed in a direction perpendicular to the first direction, the data wiring further comprising a second data wiring disposed in a direction perpendicular to the first direction, and the anode wiring further comprise a second anode wiring disposed in a direction perpendicular to the first direction, each of the projections of the gate wiring, the data wiring, and the anode wiring on the display panel forms a closed four-sided frame.

18. The display panel according to claim 1, wherein the gate wiring further comprises a gate lead terminal connected to the non-display region; and the data wiring further comprises a data lead terminal connected to the non-display region.

* * * * *